(12) United States Patent
Mitsuya et al.

(10) Patent No.: US 11,560,336 B2
(45) Date of Patent: *Jan. 24, 2023

(54) METHOD FOR PRODUCING SEMICONDUCTOR PRODUCTION DEVICE COMPONENT, AND SEMICONDUCTOR PRODUCTION DEVICE COMPONENT

(71) Applicant: NGK SPARK PLUG CO., LTD., Nagoya (JP)

(72) Inventors: Kohei Mitsuya, Inuyama (JP); Hideo Tange, Inuyama (JP); Motoki Hotta, Kasugai (JP); Takamichi Ogawa, Nagoya (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 1045 days.

This patent is subject to a terminal disclaimer.

(21) Appl. No.: 16/318,167

(22) PCT Filed: Jul. 13, 2017

(86) PCT No.: PCT/JP2017/025610
§ 371 (c)(1),
(2) Date: Jan. 16, 2019

(87) PCT Pub. No.: WO2018/016419
PCT Pub. Date: Jan. 25, 2018

(65) Prior Publication Data
US 2019/0284100 A1    Sep. 19, 2019

(30) Foreign Application Priority Data

Jul. 20, 2016 (JP) .............................. JP2016-142494
Aug. 1, 2016 (JP) .............................. JP2016-151326

(51) Int. Cl.
C04B 37/00 (2006.01)
H01L 21/687 (2006.01)
(Continued)

(52) U.S. Cl.
CPC ............ C04B 37/006 (2013.01); C04B 37/00 (2013.01); C04B 37/005 (2013.01);
(Continued)

(58) Field of Classification Search
None
See application file for complete search history.

(56) References Cited

U.S. PATENT DOCUMENTS 6,261,708 B1    7/2001  Ohashi et al.
2003/0150563 A1    8/2003  Kuibara et al.

FOREIGN PATENT DOCUMENTS

CN    1461288 A    12/2003
JP    H10-242252 A    9/1998
(Continued)

OTHER PUBLICATIONS

China National Intellecutal Property Administration, Office Action issued in corresponding Application No. 201780044445.1 dated Dec. 25, 2020 (English translation is not available.).
(Continued)

*Primary Examiner* — Xiaobei Wang
(74) *Attorney, Agent, or Firm* — Stites & Harbison, PLLC; Jeffrey A. Haeberlin; Gary N. Stewart (57) ABSTRACT

A first ceramic member and a second ceramic member are joined together at a lower joining temperature while reducing the loss of bond strength. A method for producing a semiconductor production device component includes a step of providing a first ceramic member including an AlN-based material, a step of providing a second ceramic member including an AlN-based material, and a step of joining the (Continued)

first ceramic member and the second ceramic member to each other by thermally pressing the first ceramic member and the second ceramic member to each other via a joint agent including $Eu_2O_3$, $Gd_2O_3$ and $Al_2O_3$ disposed between the first ceramic member and the second ceramic member.

8 Claims, 5 Drawing Sheets

(51) Int. Cl.
    *H01L 21/683*  (2006.01)
    *H01L 21/67*   (2006.01)
(52) U.S. Cl.
    CPC .. *H01L 21/67098* (2013.01); *H01L 21/67103* (2013.01); *H01L 21/6831* (2013.01); *H01L 21/68757* (2013.01); *H01L 21/68785* (2013.01); *C04B 2237/064* (2013.01); *C04B 2237/066* (2013.01); *C04B 2237/366* (2013.01)

(56) References Cited

FOREIGN PATENT DOCUMENTS

| JP | H11-278950 A | 10/1999 |
|----|--------------|---------|
| JP | 2004-345952 A | 12/2004 |
| KR | 2014-0132903 A | 11/2014 |

OTHER PUBLICATIONS

Japan Patent Office, International Search Report issued in PCT Application No. PCT/JP2017/025610 (the international phase of the subject application), dated Sep. 12, 2017.
Korean Intellectual Property Office, Office Action (Notification of Reason for Refusal) issued in Application No. 10-2019-7001579, dated Aug. 1, 2020.

| | JOINT AGENT-FORMING MATERIALS | JOINT LAYER-FORMING MATERIALS | JOINING TEMPERATURE | JOINING TIME | GAPS | He LEAKAGE |
|---|---|---|---|---|---|---|
| EXAMPLE | $Eu_2O_3$, $Gd_2O_3$, $Al_2O_3$ | $(Eu,Gd)_3Al_5O_{12}$, $GdAlO_3$, $Al_2O_3$ | 1675°C | 10 MINUTES | ABSENT | ABSENT |
| COMP. EX. 1 | $Eu_2O_3$, $Al_2O_3$ | $Eu_3Al_5O_{12}$, $Al_2O_3$ | 1675°C | 10 MINUTES | PRESENT | PRESENT |
| COMP. EX. 2 | $Gd_2O_3$, $Al_2O_3$ | $GdAlO_3$, $Al_2O_3$ | 1725°C | 10 MINUTES | ABSENT | ABSENT |
| COMP. EX. 3 | $Gd_2O_3$, $Al_2O_3$ | $GdAlO_3$, $Al_2O_3$ | 1675°C | 10 MINUTES | PRESENT | PRESENT |

METHOD FOR PRODUCING SEMICONDUCTOR PRODUCTION DEVICE COMPONENT, AND SEMICONDUCTOR PRODUCTION DEVICE COMPONENT

TECHNICAL FIELD

The technique disclosed in the present specification relates to a method for producing semiconductor production device components.

BACKGROUND ART

Susceptors (heating devices) are used as components in semiconductor production devices. For example, a susceptor includes a plate-shaped ceramic holding member having a built-in heater, a cylindrical ceramic supporting member disposed on one side of the holding member, and a joint layer disposed between the holding member and the supporting member so as to join one surface of the holding member and one surface of the supporting member to each other. The opposite surface of the holding member is a holding surface on which a wafer will be mounted. The susceptor heats a wafer mounted on the holding surface by means of heat generated by the application of a voltage to the heater.

The holding member and the supporting member are sometimes made of materials based on AlN (aluminum nitride) which has relatively high thermal conductivity. A known method for producing a susceptor having such AlN-based holding and supporting members is such that the holding member and the supporting member are joined together by being thermally pressed to each other via a joint agent containing Ca (calcium) between the holding member and the supporting member (see, for example, Patent Literature 1).

CITATION LIST

Patent Literature

PTL 1: Japanese Unexamined Patent Application Publication No. 2004-345952

SUMMARY OF INVENTION

Technical Problem

In the susceptor production method mentioned above, the holding member and the supporting member can be joined together at a low joining temperature of about 1600(° C.). However, the use of a Ca-containing joint agent may give rise to, for example, a contamination of workpieces such as wafers with Ca-containing products as foreign matters. An alternative susceptor production method that is known uses a joint agent containing Gd (gadolinium) instead of Ca. However, this approach involves a high joining temperature as compared to when a Ca-containing joint agent is used, and thus an improvement has been demanded.

The above problem is encountered not only in the joining of a holding member and a supporting member into a susceptor, but also in the joining of ceramic members for constituting a holding device such as, for example, an electrostatic chuck. Further, the above problem exists not only in holding devices, but also in the joining of ceramic members for constituting semiconductor production device components such as, for example, shower heads.

The present specification discloses a technique capable of solving the problem discussed above.

Solution to Problem

The technique disclosed in the present specification may be realized, for example, in the forms described below.

(1) A method for producing a semiconductor production device component disclosed in the present specification includes a step of providing a first ceramic member including an AlN-based material, a step of providing a second ceramic member including an AlN-based material, and a step of joining the first ceramic member and the second ceramic member to each other by thermally pressing the first ceramic member and the second ceramic member to each other via a joint agent including $Eu_2O_3$, $Gd_2O_3$ and $Al_2O_3$ disposed between the first ceramic member and the second ceramic member. As a result of studies and experiments, the present inventors have found that a joint agent including $Eu_2O_3$, $Gd_2O_3$ and $Al_2O_3$ can join together ceramic members including an AlN (aluminum nitride)-based material with a high bond strength even at a low joining temperature as compared to the conventional method of joining by the use of a Gd (gadolinium)-containing joint agent. Consequently, a semiconductor production device component can be thus obtained at a lower joining temperature while reducing the loss of bond strength between the first ceramic member and the second ceramic member by virtue of the use of the joint agent including $Eu_2O_3$, $Gd_2O_3$ and $Al_2O_3$.

(2) A semiconductor production device component disclosed in the present specification includes a first ceramic member including an AlN-based material, a second ceramic member including an AlN-based material, and a joint layer disposed between the first ceramic member and the second ceramic member so as to join the first ceramic member and the second ceramic member to each other, wherein the joint layer includes a composite oxide containing Eu, Gd and Al. This semiconductor production device component attains a reduction in the loss of bond strength between the first ceramic member and the second ceramic member even when produced at a low joining temperature on account of the fact that the composite oxide containing Eu (europium), Gd and Al (aluminum) exhibits fluidity at a relatively low joining temperature.

(3) In the above semiconductor production device component, the content of the composite oxide in the joint layer may be not less than 0.1 mol %. The semiconductor production device component with this configuration can attain a reduction in the loss of bond strength between the first ceramic member and the second ceramic member more effectively as a result of the composite oxide containing Eu, Gd and Al, which exhibits high fluidity even at a low temperature, being contained at not less than 0.1 mol %.

(4) A semiconductor production device component disclosed in the present specification includes a first ceramic member including an AlN-based material, a second ceramic member including an AlN-based material, and a plurality of joint sections disposed between the first ceramic member and the second ceramic member so as to join the first ceramic member and the second ceramic member to each other, wherein the joint sections each include a composite oxide containing Eu, Gd and Al. This semiconductor production device component can attain a reduction in the loss of bond strength between the first ceramic member and the second ceramic member even when produced at a low joining temperature on account of the fact that the composite oxide containing Eu, Gd and Al exhibits fluidity at a relatively low joining temperature.

(5) In the above semiconductor production device component, the content of the composite oxide in the joint sections may be not less than 0.1 mol %. The semiconductor production device component with this configuration can attain a reduction in the loss of bond strength between the first ceramic member and the second ceramic member more effectively as a result of the composite oxide containing Eu, Gd and Al, which exhibits high fluidity even at a low temperature, being contained at not less than 0.1 mol %.

The technique disclosed in the present specification may be implemented in various forms and may be embodied in the forms of semiconductor production device components, for example, holding devices such as electrostatic chucks and vacuum chucks, heating devices such as susceptors, and shower heads, and methods for producing such components.

DESCRIPTION OF EMBODIMENTS

A. Embodiment

A-1. Configuration of Susceptor 100

Figure 1:
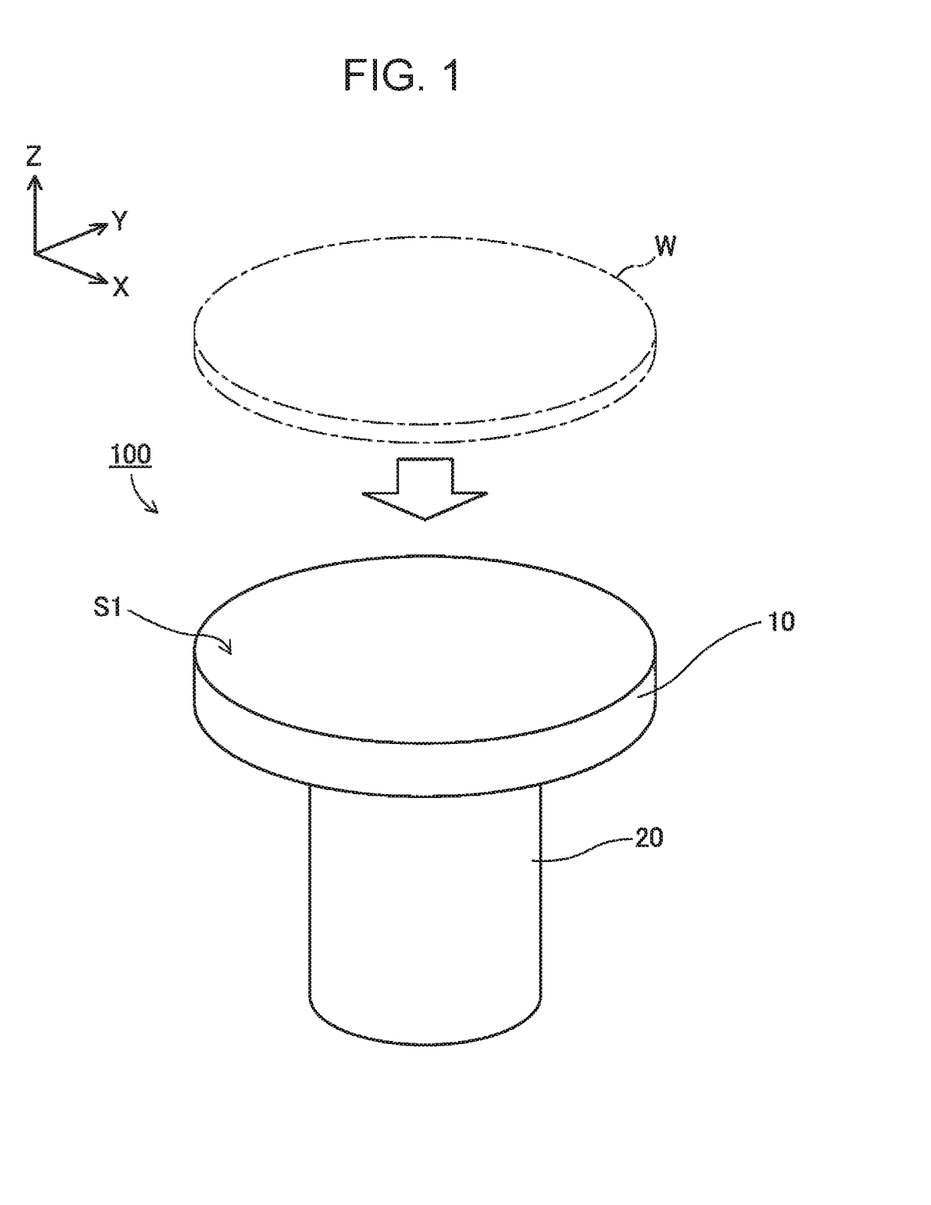
FIG. 1 is a perspective view schematically illustrating an appearance configuration of a susceptor 100 according to an embodiment.
Figure 2:
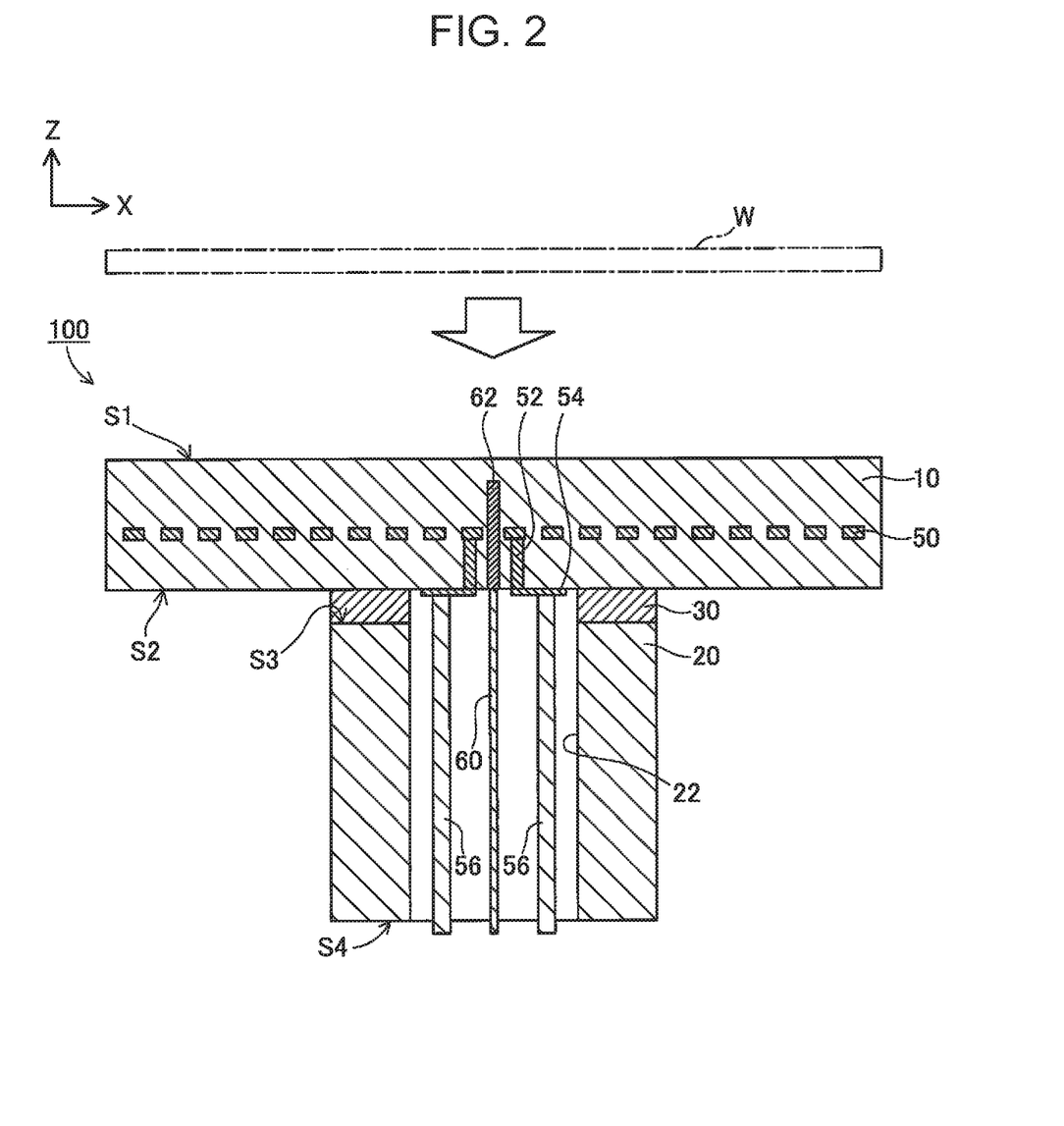
FIG. 2 is a view schematically illustrating an XZ sectional configuration of a susceptor 100 according to an embodiment.

FIG. 1 is a perspective view schematically illustrating an appearance configuration of a susceptor 100 according to the present embodiment. FIG. 2 is a view schematically illustrating an XZ sectional configuration of the susceptor 100 according to the present embodiment. In these figures, X, Y and Z axes perpendicular to one another are shown to indicate directions. In the present specification, for the sake of convenience, the positive direction on the Z axis is defined as the upward direction, and the negative direction on the Z axis as the downward direction. However, the susceptor 100 may be actually arranged in a direction which does not conform to such definitions. The susceptor 100 corresponds to the semiconductor production device component in the claims.

The susceptor 100 is a device which holds a workpiece (for example, a wafer W) and heats the workpiece to a predetermined processing temperature, and is installed in, for example, a thin-film forming device (for example, a CVD device or a sputtering device) or an etching device (for example, a plasma etching device) used in the manufacturing of semiconductor devices. The susceptor 100 includes a holding member 10 and a supporting member 20 which are arranged adjacent to each other in a predetermined arrangement direction (in the present embodiment, in the vertical (Z axis) direction). The holding member 10 and the supporting member 20 are arranged so that the lower surface of the holding member 10 (hereinafter, written as the "holder-side joint surface S2") and the upper surface of the supporting member 20 (hereinafter, written as the "support-side joint surface S3") are opposed to each other in the arrangement direction. The susceptor 100 further includes a joint layer 30 disposed between the holder-side joint surface S2 of the holding member 10 and the support-side joint surface S3 of the supporting member 20. The holding member 10 corresponds to the first ceramic member in the claims, and the supporting member 20 to the second ceramic member in the claims.

(Holding Member 10)

For example, the holding member 10 is a plate-shaped member having a flat circular surface, and is made of a ceramic based on AlN (aluminum nitride). Here, the term "based" means that the component has the largest proportion (weight proportion). For example, the diameter of the holding member 10 is about 100 (mm) to 500 (mm). For example, the thickness of the holding member 10 is about 3 (mm) to 10 (mm).

Within the holding member 10, a heater 50 is disposed which is composed of a linear resistive heating element formed of a conductive material (such as, for example, tungsten or molybdenum). A pair of ends of the heater 50 are arranged near the central portion of the holding member 10. Further, a pair of vias 52 are disposed within the holding member 10. Each via 52 is a linear conductor extending in the vertical direction. The upper ends of the vias 52 are connected to the respective ends of the heater 50, and the lower ends of the vias 52 are disposed on the holder-side joint surface S2 of the holding member 10. Further, a pair of receiving electrodes 54 are disposed near the central portion of the holder-side joint surface S2 of the holding member 10. The receiving electrodes 54 are connected to the respective lower ends of the vias 52 so as to establish an electrical connection between the heater 50 and the receiving electrodes 54.

(Supporting Member 20)

For example, the supporting member 20 is a cylindrical member extending in the vertical direction, and has a through hole 22 extending in the vertical direction from the support-side joint surface S3 (the upper surface) to the lower surface S4. Similarly to the holding member 10, the supporting member 20 is made of a ceramic based on AlN. The supporting member 20 has an outer diameter of, for example, about 30 (mm) to 90 (mm), an inner diameter of, for example, about 10 (mm) to 60 (mm), and a vertical length of, for example, about 100 (mm) to 300 (mm). The through hole 22 of the supporting member 20 accommodates a pair of electrode terminals 56. Each electrode terminal 56 is a rod-shaped conductor extending in the vertical direction. The upper ends of the electrode terminals 56 are brazed to the respective receiving electrodes 54. When a voltage is applied from a power source (not shown) to the pair of electrode terminals 56, the heater 50 is caused to generate heat, which heats the holding member 10 and then heats the wafer W held on the upper surface (hereinafter, written as the "holding surface S1") of the holding member 10. For example, the heater 50 is arranged substantially concentrically as viewed in the Z direction so as to be capable of heating the holding surface S1 of the holding member 10 as uniformly as possible. Further, the through hole 22 of the supporting member 20 accommodates two metal wires 60 as a thermocouple (only one metal wire is illustrated in FIG. 2). Each metal wire 60 extends in the vertical direction, and an upper end portion 62 of each metal wire 60 is buried in the central portion of the holding member 10. This structure allows the temperature inside the holding member 10 to be measured, and the temperature of the wafer W to be controlled based on the measurement result.

(Joint Layer 30)

The joint layer 30 is a sheet layer shaped like a circular ring, and joins together the holder-side joint surface S2 of the holding member 10 and the support-side joint surface S3 of the supporting member 20. The joint layer 30 is formed of materials which include a composite oxide containing Eu (europium), Gd (gadolinium) and Al (aluminum). Specifically, the joint layer 30 is formed of materials including $(Eu,Gd)_3Al_5O_{12}$, $GdAlO_3$ and $Al_2O_3$ (alumina). The joint layer 30 has an outer diameter of, for example, about 30 (mm) to 90 (mm), an inner diameter of, for example, about 10 (mm) to 60 (mm), and a thickness of, for example, about 2 (μm) to 60 (μm).

A-2. Method for Producing Susceptor 100

Figure 3:
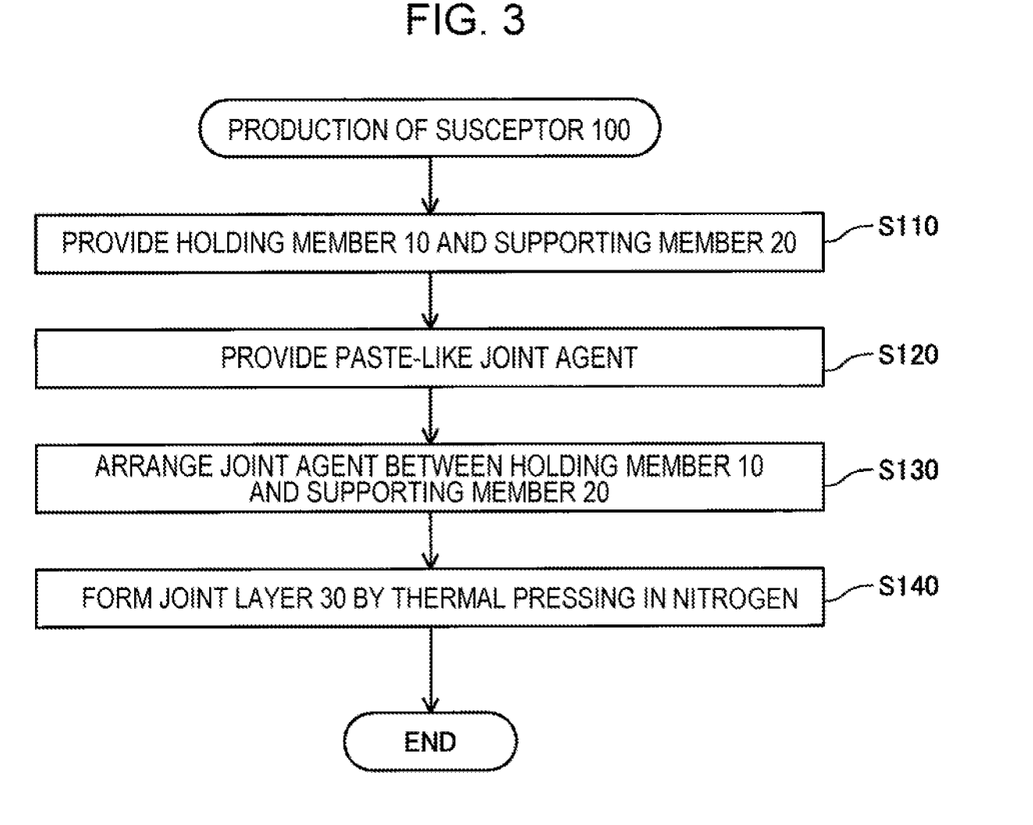
FIG. 3 is a flow chart illustrating a method for producing a susceptor 100 according to an embodiment.

Next, a method for producing a susceptor 100 of the present embodiment will be described. FIG. 3 is a flow chart illustrating a method for producing a susceptor 100 according to the present embodiment. First, a holding member 10 and a supporting member 20 are provided (S110). As mentioned earlier, the holding member 10 and the supporting member 20 are both made of a ceramic based on AlN. The holding member 10 and the supporting member 20 are producible by known methods, and thus the description of the methods for their production will be omitted.

Next, a paste-like joint agent for forming a joint layer 30 is provided (S120). Specifically, $Eu_2O_3$ (europium oxide) powder, $Gd_2O_3$ (gadolinia) powder and $Al_2O_3$ powder are mixed together in a predetermined ratio and are further mixed with an acrylic binder and butylcarbitol to give a paste-like joint agent. The composition ratio of the materials forming the paste-like joint agent is preferably, for example, 20 mol % $Eu_2O_3$, 20 mol % $Gd_2O_3$ and 60 mol % $Al_2O_3$. Next, the paste-like joint agent that has been provided is arranged between the holding member 10 and the supporting member 20 (S130). Specifically, the holder-side joint surface S2 of the holding member 10 and the support-side joint surface S3 of the supporting member 20 are lapped so that the joint surfaces S2 and S3 have a surface roughness of not more than 1 μm and a flatness of not more than 10 μm. Next, mask printing is performed to spread the paste-like joint agent over at least one of the holder-side joint surface S2 of the holding member 10 and the support-side joint surface S3 of the supporting member 20, followed by degreasing treatment. Thereafter, the support-side joint surface S3 of the supporting member 20 and the holder-side joint surface S2 of the holding member 10 are superimposed one on top of the other via the paste-like joint agent, thereby forming a stack of the holding member 10 and the supporting member 20.

Next, the stack of the holding member 10 and the supporting member 20 is placed into a hot press furnace, and is heated while being pressed in $N_2$ (nitrogen) (S140). Consequently, the paste-like joint agent is melted to form a joint layer 30, and the holding member 10 and the supporting member 20 are joined together by the joint layer 30. The pressure during this thermal pressure bonding is preferably set in the range of not less than 0.1 MPa and not more than 15 MPa. Controlling the pressure during the thermal pressure bonding at 0.1 MPa or above ensures that the members will be joined together without gaps therebetween even in the presence of irregularities such as waves on the surface of the members that are to be joined (the holding member 10 and the supporting member 20), thus making it possible to prevent an early decrease in the bond strength between the holding member 10 and the supporting member 20 (the bond strength of the joint layer 30). By controlling the pressure during the thermal pressure bonding at 15 MPa or below, the holding member 10 can be prevented from cracking and the supporting member 20 from being deformed. Incidentally, the joint surfaces S2 and S3 are subjected to a pressure of 0.2 kgf/cm² to 3 kgf/cm².

During the thermal pressure bonding, the temperature is preferably raised to 1675(° C.). When the temperature is raised to 1675(° C.) during the thermal pressure bonding, the temperature is kept at 1675(° C.) for about 10 (minutes) and thereafter the temperature inside the hot press furnace is lowered to room temperature. After the thermal pressure bonding, post treatments (such as polishing of the circumferences and the upper and lower surfaces, and the formation of terminals) are performed as required. A susceptor 100 having the aforementioned configuration is produced by the production method described above.

A-3. Performance Evaluation

Susceptor 100 of EXAMPLE and susceptors of COMPARATIVE EXAMPLES 1 to 3 were tested as described below to evaluate their performance.

A-3-1. Example and Comparative Examples 1 to 3

Figure 4:
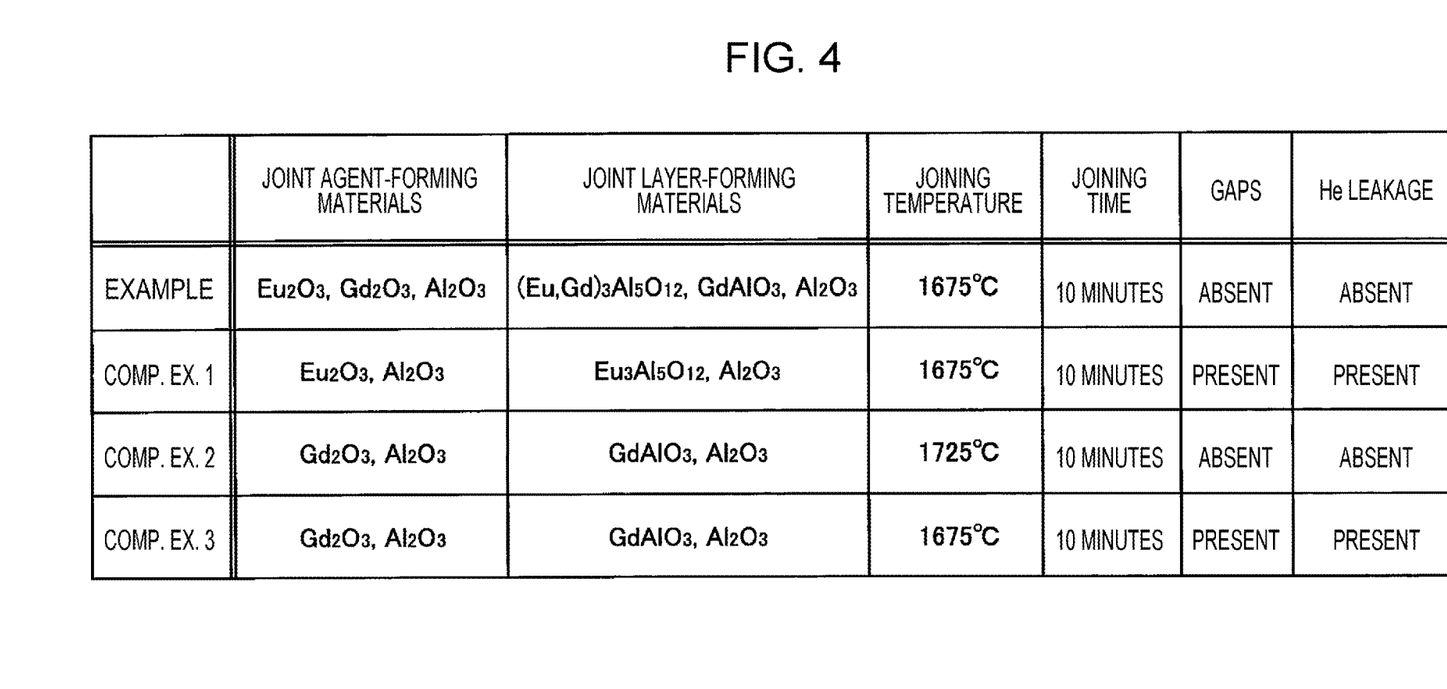
FIG. 4 is a table describing the results of performance evaluation of susceptor 100.

FIG. 4 is a table describing the results of performance evaluation of the susceptor 100. The susceptor 100 of EXAMPLE is one produced by the production method described hereinabove. The susceptors of COMPARATIVE EXAMPLES 1 to 3 include a holding member, a supporting member and a joint layer. The susceptors of COMPARATIVE EXAMPLES 1 to 3 were produced by production methods which differed from that for the production of the susceptor 100 of EXAMPLE in at least either of the joint agent-forming materials and the joining temperature. The susceptor 100 of EXAMPLE and the susceptors of COMPARATIVE EXAMPLES are common in the following.

(Configuration of Holding Member)
   Material: AlN-based ceramic
   Diameter: 100 (mm) to 500 (mm)
   Thickness: 3 (mm) to 10 (mm)

(Configuration of Supporting Member)
   Material: AlN-based ceramic
   Outer diameter: 30 (mm) to 90 (mm)
   Inner diameter: 10 (mm) to 60 (mm)
   Vertical length: 100 (mm) to 300 (mm)

(Profile of Joint Layer)
   Outer diameter: 30 (mm) to 90 (mm)
   Inner diameter: 10 (mm) to 60 (mm)
   Thickness: 2 (μm) to 60 (μm)

As described in FIG. 4, the susceptor 100 of EXAMPLE and the susceptors of COMPARATIVE EXAMPLES 1 to 3 have at least one difference in the joint agent-forming materials (the joint layer-forming materials) and the joining temperature. Specifically, the differences will be described below. The joint layer-forming materials are materials which arise from the chemical reaction of the joint agent-forming materials by the aforementioned thermal pressing.

Susceptor 100 of Example:
   Joint agent-forming materials: Including $Eu_2O_3$, $Gd_2O_3$ and $Al_2O_3$.
   Joint layer 30-forming materials: Including $(Eu,Gd)_3Al_5O_{12}$, $GdAlO_3$ and $Al_2O_3$.
   Joining temperature: 1675(° C.)

Susceptor of Comparative Example 1:
  Joint agent-forming materials: Including $Eu_2O_3$ and $Al_2O_3$, and free from $Gd_2O_3$.
  Joint layer-forming materials: Including $Eu_3Al_5O_{12}$ and $Al_2O_3$, and free from $Gd_3Al_5O_{12}$ and $GdAlO_3$.
  Joining temperature: Same as in EXAMPLE.
Susceptor of Comparative Example 2:
  Joint agent-forming materials: Including $Gd_2O_3$ and $Al_2O_3$, and free from $Eu_2O_3$.
  Joint layer-forming materials: Including $GdAlO_3$ and $Al_2O_3$, and free from $(Eu,Gd)_3Al_5O_{12}$.
  Joining temperature: 1725(° C.) (Higher than in EXAMPLE.)
Susceptor of Comparative Example 3:
  Joint agent-forming materials: Same as COMPARATIVE EXAMPLE 2.
  Joint layer-forming materials: Same as COMPARATIVE EXAMPLE 2.
  Joining temperature: Same as in EXAMPLE. (Lower than in COMPARATIVE EXAMPLE 2.)

A-3-2. Evaluation Procedures

To evaluate the bond strength of the joint layer, the susceptor 100 of EXAMPLE and the susceptors of COMPARATIVE EXAMPLES 1 to 3 were subjected to He (helium) leak test and SEM (scanning electron microscopy) observation.
(He Leak Test)
In the He leak test, for example, a He leak detector (not shown) is connected to the lower open end of the supporting member 20 of the susceptor 100 of EXAMPLE, and He gas is blown to the outer periphery of the joint layer 30. The presence or absence of He leakage through the joint layer 30 was detected based on the detection results from the He leak detector. He leakage being detected means that voids are present in the joint layer 30 and the bond strength is low.
(SEM Observation)
For example, the susceptor 100 of EXAMPLE was cut to give a test piece with a predetermined size for SEM observation, the test piece being sampled from a joint portion including the holding member 10, the supporting member 20 and the joint layer 30. The test piece was observed by SEM.

Figure 5:
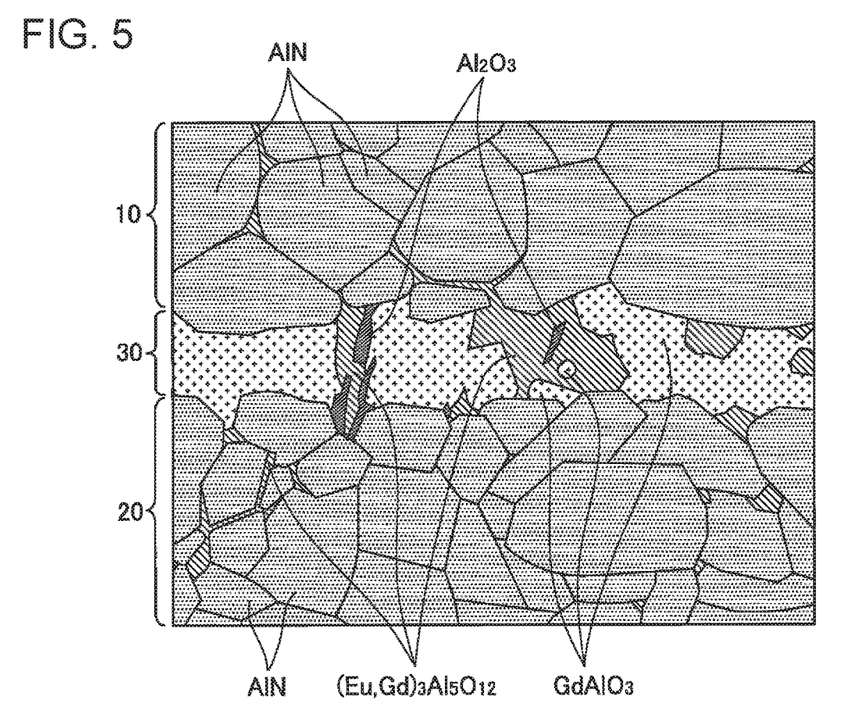
FIG. 5 is a view schematically illustrating an SEM image of a susceptor 100 of EXAMPLE.
Figure 6:
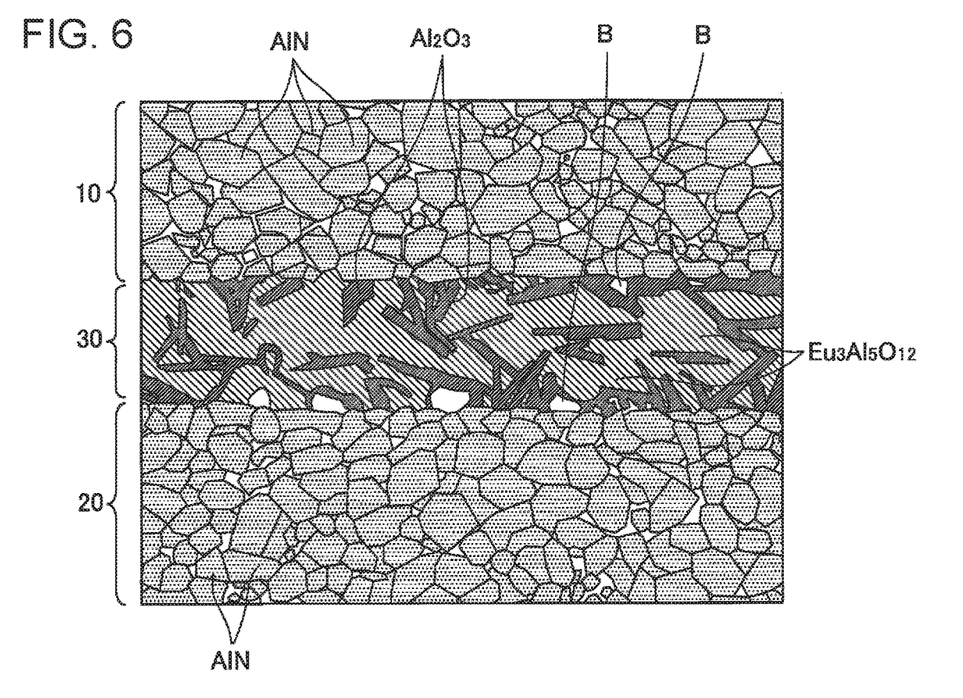
FIG. 6 is a view schematically illustrating an SEM image of a susceptor of COMPARATIVE EXAMPLE 1.

A-3-3. Evaluation Results (He Leak Test)
In the He leak test for the susceptor 100 of EXAMPLE and the susceptor of COMPARATIVE EXAMPLE 2, no leakage of He was detected. He leakage was detected in the He leak test for the susceptors of COMPARATIVE EXAMPLES 1 and 3.
(SEM Observation)
FIG. 5 is a view schematically illustrating an SEM image of the susceptor 100 of EXAMPLE. FIG. 6 is a view schematically illustrating an SEM image of the susceptor of COMPARATIVE EXAMPLE 1. In the susceptor 100 of EXAMPLE, as illustrated in FIG. 5, the joint layer 30-forming materials $(Eu,Gd)_3Al_5O_{12}$, $GdAlO_3$ and $Al_2O_3$, in particular $(Eu,Gd)_3Al_5O_{12}$, were distributed so as to bury gaps between AlN particles forming the holding member 10 and the supporting member 20, gaps at the boundary between the holding member 10 and the joint layer 30, and gaps at the boundary between the supporting member 20 and the joint layer 30 (hereinafter, these gaps are collectively referred to as the "gaps"). The joint agent used in the production of the susceptor 100 of EXAMPLE which includes $Eu_2O_3$, $Gd_2O_3$ and $Al_2O_3$ exhibits high fluidity even at a relatively low temperature of 1675(° C.). Thus, the joint agent probably penetrated into the gaps such as those between AlN particles and formed the joint layer 30 while filling the gaps with any of $(Eu,Gd)_3Al_5O_{12}$, $GdAlO_3$ and $Al_2O_3$. In the He leak test, the susceptor 100 of EXAMPLE was detected to be free from He leakage probably because the gaps had been buried. Incidentally, a three-point bending test of the susceptor 100 of EXAMPLE showed that the bond strength of the joint layer 30 was approximately 90% of the reference load. The reference load is the breaking load of a matrix entirely formed of AlN-based ceramic.

In the susceptor of COMPARATIVE EXAMPLE 1, as illustrated in FIG. 6, $Eu_3Al_5O_{12}$ and $Al_2O_3$ were both absent in the gaps, leaving the gaps as voids B. The joint agent used in the production of the susceptor of COMPARATIVE EXAMPLE 1 which includes $Eu_2O_3$ and $Al_2O_3$ exhibits low fluidity at a relatively low temperature of 1675(° C.). Thus, the joint agent probably failed to penetrate into the gaps and formed the joint layer while leaving the gaps as voids B. The susceptor of COMPARATIVE EXAMPLE 1 allowed He to leak in the He leak test probably because the gaps had not been buried. In view of the fact that many voids B are present in the joint layer of the susceptor of COMPARATIVE EXAMPLE 1, the bond strength of the joint layer will be lower than the bond strength of the joint layer 30 of the susceptor 100 of EXAMPLE.

In the susceptor of COMPARATIVE EXAMPLE 2, although not illustrated, the joint layer-forming materials $GdAlO_3$ and $Al_2O_3$ were distributed so as to bury the gaps. In contrast, the susceptor of COMPARATIVE EXAMPLE 3, although not illustrated, was such that the joint layer-forming materials $GdAlO_3$ and $Al_2O_3$ were both absent in the gaps, leaving the gaps as voids. In spite of the fact that the joint layer (joint agent)-forming materials were identical in the susceptor of COMPARATIVE EXAMPLE 2 and the susceptor of COMPARATIVE EXAMPLE 3, the results of SEM observation were different. This difference probably stems from the fact that the joint agent used in the production of the susceptors of COMPARATIVE EXAMPLES 2 and 3 which includes $Gd_2O_3$ and $Al_2O_3$ exhibits high fluidity at a relatively high temperature of 1725(° C.) but is poor in fluidity at a relatively low temperature of 1675(° C.). The susceptor of COMPARATIVE EXAMPLE 2 did not leak He in the He leak test probably because the gaps had been buried. The susceptor of COMPARATIVE EXAMPLE 3 allowed He to leak in the He leak test probably because the gaps had not been buried. The joint layer of the susceptor of COMPARATIVE EXAMPLE 2 contained less gaps, and thus the bond strength of the joint layer will be similar to the bond strength of the joint layer 30 of the susceptor 100 of EXAMPLE. The joint layer of the susceptor of COMPARATIVE EXAMPLE 3 contained many voids, and thus the bond strength of the joint layer will be lower than the bond strength of the joint layer 30 of the susceptor 100 of EXAMPLE.

A-4. Effects of Present Embodiment

As a result of studies and experiments, the present inventors have found that the joint agent including $Eu_2O_3$, $Gd_2O_3$ and $Al_2O_3$ can join together ceramic members including an AlN-based material with a high bond strength even at a low joining temperature as compared to the conventional method of joining by the use of a Gd-containing joint agent. According to the present embodiment, the joint agent including $Eu_2O_3$, $Gd_2O_3$ and $Al_2O_3$ can form a joint layer 30 at a lowered joining temperature while attaining a reduction in the loss of bond strength. Specifically, as demonstrated hereinabove, the susceptor 100 of EXAMPLE can attain a bond strength comparable to that in the susceptor of COMPARATIVE EXAMPLE 2 involving a $Gd_2O_3$-containing joint agent, at a lower joining temperature. Further, the reduction in joining temperature protects the holding member 10 and the supporting member 20 from thermal deformation. Further, according to the present embodiment, high bond strength can be attained at a lowered joining temperature in as short a joining time as about 10 minutes. The reduction in joining time leads to an enhancement in the production efficiency of the susceptor 100.

According to the present embodiment, the loss of bond strength of the joint layer 30 can be reduced more effectively by controlling the content of $(Eu,Gd)_3Al_5O_{12}$ which exhibits high fluidity even at a low temperature to not less than 0.1 mol %.

B. Modified Example

The technique disclosed in the present specification is not limited to the embodiment illustrated above, and various modifications are possible without departing from the spirit thereof. For example, the following modifications are possible.

In the embodiment described above, the holding member 10 and the supporting member 20 may be joined together via a plurality of joint sections instead of the joint layer 30. Specifically, a plurality of joint sections may be dispersed on a single virtual plane perpendicular to the direction in which the holding member 10 and the supporting member 20 are opposed to each other, and the holding member 10 and the supporting member 20, with the joint sections disposed between the holding member 10 and the supporting member 20, may be partly connected via AlN particles forming the holding member 10 and the supporting member 20.

In the embodiment and the modified example described above, for example, a second joint layer (second joint sections) having a different composition from the joint layer 30 (the joint sections) may be arranged together with the joint layer 30 (the joint sections) between the holding member 10 and the supporting member 20. That is, the holding member 10 and the supporting member 20 may be joined together via a plurality of joint layers or a plurality of types of joint sections having different compositions.

The ceramics forming the holding member 10 and the supporting member 20 in the embodiment and the modified example described above are based on AlN and may contain other elements.

In the embodiment and the modified example described above, the materials forming the joint layer 30 (the joint sections) may include a composite oxide which contains Eu, Gd and Al, other than $(Eu,Gd)_3Al_5O_{12}$. The materials forming the joint layer 30 (the joint sections) may include substances (for example, AlN) other than $Al_2O_3$ and $GdAlO_3$. As is the case in the embodiment described above, the materials forming the joint layer 30 (the joint sections) preferably include two or more kinds of substances which include one or more perovskite or garnet composite oxides containing a rare earth element and Al, and $Al_2O_3$. The content of $(Eu,Gd)_3Al_5O_{12}$ in the joint layer 30 may be less than 0.1 mol %, but is preferably 0.1 mol % or above.

In the embodiment and the modified example described above, the materials forming the joint agent may include other elements as long as it includes $Eu_2O_3$, $Gd_2O_3$ and $Al_2O_3$.

The method for producing the susceptor 100 described in the aforementioned embodiment is only illustrative, and various modifications are possible.

The present invention is applicable not only to the susceptors 100, but also to other semiconductor production device components, for example, other types of heating devices such as polyimide heaters, holding devices (for example, electrostatic chucks and vacuum chucks) which have a ceramic plate and a base plate and are configured to hold a workpiece on the surface of the ceramic plate, and shower heads.

REFERENCE SIGNS LIST

10: HOLDING MEMBER 20: SUPPORTING MEMBER 22: THROUGH HOLE 30: JOINT LAYER 50: HEATER 52: VIA 54: RECEIVING ELECTRODE 56: ELECTRODE TERMINAL 60: METAL WIRE 62: UPPER END PORTION 100: SUSCEPTOR B: VOID S1: HOLDING SURFACE S2: HOLDER-SIDE JOINT SURFACE S3: SUPPORT-SIDE JOINT SURFACE S4: LOWER SURFACE W: WAFER

The invention claimed is:

1. A method for producing a semiconductor production device component, comprising:
    a step of providing a first ceramic member including an AlN-based material,
    a step of providing a second ceramic member including an AlN-based material, and
    a step of joining the first ceramic member and the second ceramic member to each other by thermally pressing the first ceramic member and the second ceramic member to each other via a joint agent including $Eu_2O_3$, $Gd_2O_3$ and $Al_2O_3$ disposed between the first ceramic member and the second ceramic member,
    wherein a joint layer made by melting the joint agent in the thermal pressing of the first ceramic member and the second ceramic member to each other includes $(Eu,Gd)_3Al_5O_{12}$ and $GdAlO_3$.

2. A semiconductor production device component comprising:
    a first ceramic member including an AlN-based material,
    a second ceramic member including an AlN-based material, and
    a joint layer disposed between the first ceramic member and the second ceramic member so as to join the first ceramic member and the second ceramic member to each other,
    wherein the joint layer includes $(Eu,Gd)_3Al_5O_{12}$ and $GdAlO_3$.

3. The semiconductor production device component according to claim 2, wherein
    in the joint layer,
        the content of $(Eu,Gd)_3Al_5O_{12}$ is not less than 0.1 mol %.

4. A semiconductor production device component comprising:
    a first ceramic member including an AlN-based material,
    a second ceramic member including an AlN-based material, and a plurality of joint sections disposed between the first ceramic member and the second ceramic member so as to join the first ceramic member and the second ceramic member to each other,
wherein the joint sections each include $(Eu,Gd)_3Al_5O_{12}$ and $GdAlO_3$.

5. The semiconductor production device component according to claim 4, wherein
in the joint sections,
the content of $(Eu,Gd)_3Al_5O_{12}$ is not less than 0.1 mol %.

6. The method according to claim 1, wherein the joint layer made by melting the joint agent in the thermal pressing of the first ceramic member and the second ceramic member to each other further includes $Al_2O_3$.

7. The semiconductor production device component according to claim 2, wherein the joint layer further includes $Al_2O_3$.

8. The semiconductor production device component according to claim 4, wherein the joint sections each further include $Al_2O_3$.

* * * * *